United States Patent
Tsai et al.

(10) Patent No.: US 12,229,680 B2
(45) Date of Patent: Feb. 18, 2025

(54) NEURAL NETWORK ACCELERATORS RESILIENT TO CONDUCTANCE DRIFT

(71) Applicant: International Business Machines Corporation, Armonk, NY (US)

(72) Inventors: HsinYu Tsai, San Jose, CA (US); Stefano Ambrogio, San Jose, CA (US); Sanjay Kariyappa, Atlanta, GA (US); Mathieu Gallot, Les Sables-d'Olonne (FR)

(73) Assignee: International Business Machines Cororation, Armonk, NY (US)

( * ) Notice: Subject to any disclaimer, the term of this patent is extended or adjusted under 35 U.S.C. 154(b) by 1055 days.

(21) Appl. No.: 17/035,005

(22) Filed: Sep. 28, 2020

(65) Prior Publication Data

US 2022/0101142 A1    Mar. 31, 2022

(51) Int. Cl.
  *G06N 3/04*    (2023.01)
  *G06N 3/048*   (2023.01)
  *G06N 3/063*   (2023.01)
  *G06N 3/065*   (2023.01)
  *G06N 3/08*    (2023.01)
  *G06N 3/084*   (2023.01)

(52) U.S. Cl.
  CPC ............. *G06N 3/084* (2013.01); *G06N 3/048* (2023.01); *G06N 3/063* (2013.01)

(58) Field of Classification Search
  CPC ........ G06N 3/084; G06N 3/048; G06N 3/063; G06N 3/065; G11C 13/0004; G11C 13/0035; G11C 11/54; G11C 2213/77
  See application file for complete search history.

(56) References Cited

U.S. PATENT DOCUMENTS

| | | | |
|---|---|---|---|
| 10,332,315 B2 | 6/2019 | Samec | |
| 2017/0109626 A1 | 4/2017 | Gokmen | |
| 2018/0253642 A1 | 6/2018 | Gokmen | |
| 2019/0147329 A1* | 5/2019 | Hekmatshoartabari | ...................... G06N 3/065 706/26 |
| 2020/0041964 A1* | 2/2020 | Alsaleem | ............... G05B 13/04 |
| 2020/0218963 A1* | 7/2020 | Yasuda | .................. G06N 3/048 |
| 2020/0311341 A1* | 10/2020 | Chaturvedi | .............. G06N 3/04 |
| 2021/0065794 A1* | 3/2021 | Burr | ...................... G06F 3/0679 |

OTHER PUBLICATIONS

Anonymous, "Design of neural networks based on cost estimation," IP.com, Disclosure No. IPCOM000257359D, Feb. 5, 2019, 11 pages. <https://ip.com/IPCOM/000257359>.

(Continued)

*Primary Examiner* — Brandon S Cole
(74) *Attorney, Agent, or Firm* — Eric W. Chesley

(57) ABSTRACT

A method comprises receiving an input signal for processing in one or more neurons of a neural network, wherein the neural network has zero bias neurons and includes a plurality of resistive processing unit (RPU) weights and each neuron has an activation function. The method also includes applying an arbitrary amplification factor to activation function outputs of the one or more neurons in the neural network, wherein the arbitrary amplification factor is based on a dynamic range of components in the neural network and compensates for conductance drift in values of the RPU weights. The method also includes performing a calculation with the neural network using the amplified activation function outputs of the one or more neurons.

25 Claims, 5 Drawing Sheets

(56) References Cited

OTHER PUBLICATIONS

Anonymous, "Efficient Accelerators for Matrix Multiplication in Machine Learning," IP.com, Disclosure No. IPCOM000243676D, Oct. 9, 2015, 4 pages. <https://ip.com/IPCOM/000243676>.

Anonymous, "Method and circuit for implementing hyperbolic tangent activation function in neural network accelerators," IP.com, Disclosure No. IPCOM000254761D, Jul. 30, 2018, 3 pages. <https://ip.com/IPCOM/000254761>.

Anonymous, "System for the computation of a Dynamic Resiliency Score (DRS) using Supervised Machine Learning," IP.com, Disclosure No. IPCOM000249430D, Feb. 27, 2017, 6 pages. <https://ip.com/IPCOM/000249430>.

Imani et al., "RAPIDNN: In-Memory Deep Neural Network Acceleration Framework," arXiv:1806.05794v4, Apr. 11, 2019, 13 pages. <https://arxiv.org/pdf/1806.05794>.

Jain et al., "RxNN: A Framework for Evaluating Deep Neural Networks on Resistive Crossbars," arXiv:1809.00072v2, Jan. 18, 2019, 12 pages. <https://arxiv.org/pdf/1809.00072>.

Mittal, "A Survey of ReRAM-Based Architectures for Processing-In-Memory and Neural Networks," Machine Learning & Knowledge Extraction, Apr. 30, 2018, vol. 1, pp. 75-114, doi:10.3390/make1010005.

Tsai et al., "Mitigation of Conductance Drift in Neural Network Resistive Processing Units," U.S. Appl. No. 16/388,320, filed Apr. 18, 2019.

Tsai et al., "Drift regularization to counteract variation in drift coefficients for analog accelerators," U.S. Appl. No. 16/905,241, filed Jun. 18, 2020.

\* cited by examiner

NEURAL NETWORK ACCELERATORS RESILIENT TO CONDUCTANCE DRIFT

BACKGROUND

An artificial neural network (ANN) is an information processing system that is inspired by biological nervous systems, such as the brain. One element of ANNs is the structure of the information processing system, which includes a large number of highly interconnected processing elements (called "neurons") working in parallel to solve specific problems. ANNs are furthermore trained in-use, with learning that involves adjustments to weights that exist between the neurons. An ANN is configured for a specific application, such as pattern recognition or data classification, through such a learning process.

ANNs demonstrate an ability to derive meaning from complicated or imprecise data and can be used to extract patterns and detect trends that are too complex to be detected by humans or other computer-based systems. The structure of a neural network is known generally to have input neurons that provide information to one or more "hidden" neurons. Connections between the input neurons and hidden neurons are weighted and these weighted inputs are then processed by the hidden neurons according to a function in the hidden neurons, with weighted connections between the layers. There can be any number of layers of hidden neurons, and as well as neurons that perform different functions. There exist different neural network structures as well, such as convolutional neural network, recurrent neural network, maxout network, etc. Finally, a set of output neurons accepts and processes weighted input from the last set of hidden neurons.

SUMMARY

Aspects of the disclosure may include a method, computer program product, and system. One example of the method comprises receiving an input signal for processing in one or more neurons of a neural network, wherein the neural network has zero bias neurons and includes a plurality of resistive processing unit (RPU) weights and each neuron has an activation function. The method also includes applying an arbitrary amplification factor to activation function outputs of the one or more neurons in the neural network, wherein the arbitrary amplification factor is based on a dynamic range of components in the neural network and compensates for conductance drift in values of the RPU weights. The method also includes performing a calculation with the neural network using the amplified activation function outputs of the one or more neurons.

The above summary is not intended to describe each illustrated embodiment or every implementation of the present disclosure.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
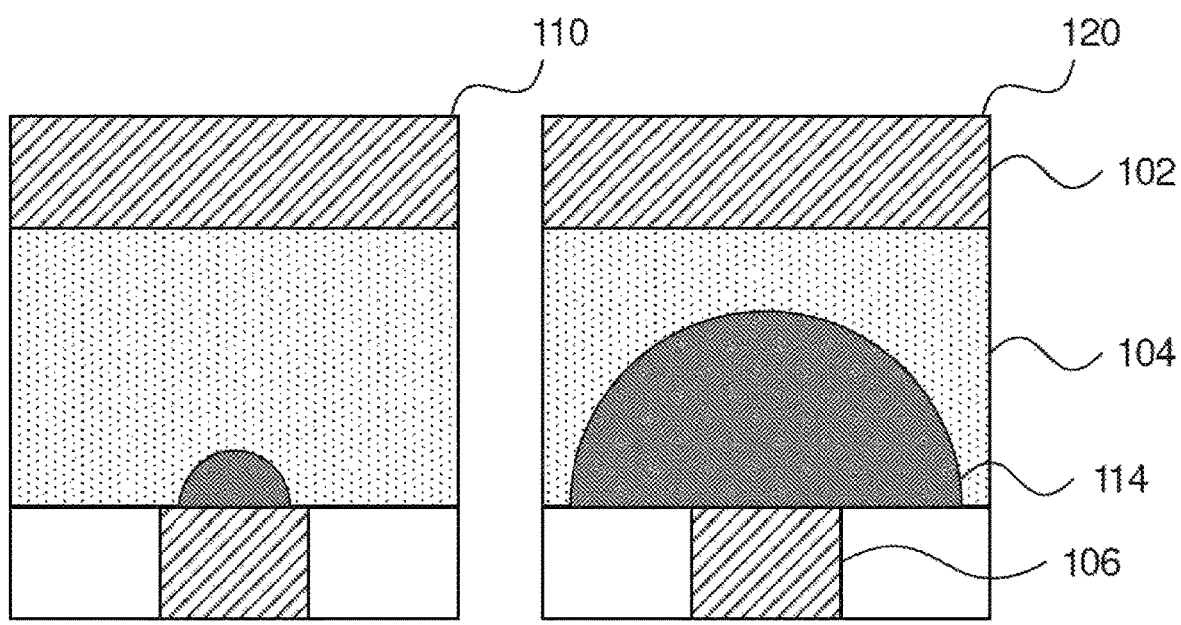
FIG. 1 depicts one embodiment of an example PCM structure.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

As used herein, "a number of" when used with reference items, means one or more items. For example, "a number of different types of networks" is one or more different types of networks.

Further, the phrases "at least one", "one or more," and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together. In other words, "at least one of", "one or more of", and "and/or" mean any combination of items and number of items may be used from the list, but not all of the items in the list are required. The item may be a particular object, a thing, or a category. Additionally, the amount or number of each item in a combination of the listed items need not be the same. For example, in some illustrative examples, "at least one of A, B, and C" may be, for example, without limitation, two of item A; one of item B; and ten of item C; or 0 of item A; four of item B and seven of item C; or other suitable combinations.

Additionally, the term "a" or "an" entity refers to one or more of that entity. As such, the terms "a" (or "an"), "one or more" and "at least one" can be used interchangeably herein. It is also to be noted that the terms "comprising," "including," and "having" can be used interchangeably.

Furthermore, the term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

Several applications of artificial Deep Neural Networks (DNNs) demand that these models run on resource-constrained platforms such as mobile phones and edge devices with a low energy budget. This can be challenging, as DNN models with state-of-the-art classification accuracies have high compute and memory requirements, with each inference pass typically requiring on the order of millions of multiply-accumulate operations. To address this problem, digital accelerators may be used, which offer significant improvements in speed and energy efficiency over CPUs and GPUs. Digital accelerators may be based on von Neumann architectures, in which data are stored in a separate off-chip memory (usually DRAM) and transferred on-chip in order to perform computations. A drawback of such designs is that the energy associated with data movement often ends up being a dominant factor, limiting the energy efficiency that can be achieved.

Analog computation with in-memory computation offers an alternative for hardware acceleration of DNNs. Analog accelerators leverage crossbar array structures to store data and perform computation in the analog domain using resistive memory devices. In particular, weights can be implemented using resistive processing units (RPUs), where a resistance of the RPU determines the value of the weight. Such structures can be used to reduce energy consumption and speed of processing by performing parallelized operations in the analog domain, at the location of data storage in memory. The RPU devices can be implemented with resistive random access memory (RRAM), phase change memory (PCM), programmable metallization cell (PMC) memory, Memristors or any other device that has non-linear resistive switching characteristics. Such RPU devices can also be considered as memristive systems.

PCM devices have various advantages compared to other memory technologies which make it a desirable memory device. One advantage is that PCM devices degrade slower than other technologies. That is PCM devices can be cycled (e.g. written to and erased) more times than other memory technologies. For example, some flash memory devices are rated for only 5,000 writes per sector whereas some PCM devices can endure approximately 100 million write cycles. Additionally, the resistivity of the memory in PCM devices is more stable than other types of memory devices. Another advantage is that PCM devices can provide a wider conductance contrast window than other memory technologies. That is, the ratio between the highest and the lowest conductance levels is larger than for some other memory technologies. For implementing analog levels where intermediate states between maximum and minimum states can be used, this larger conductance window makes such implementation easier than with technologies having a smaller conductance window. Intermediate conductance states in PCM devices can be achieved by modulating the volume ratio between the amorphous and crystalline phases of a chalcogenide material.

When encoding DNN weights as conductance values, one or more pairs of PCM devices can be used to represent each weight. This provides coverage for both positive and negative weights, improves conductance dynamic range, and reduces the effect of device noise. DNN inference may be performed with weights computed from analog conductance values that are programmed and measured from arrays of PCM devices. In some implementations, all computations in DNN inference are performed within or at the edge of the crossbar array in the analog domain, without the need to move weights to a separate compute unit or to convert activations to digital bit representation.

FIG. 1 depicts one embodiment of an example PCM structure that can be used in a neural network to represent a weight. The structure is shown in two states, including a first resistance state 110 and a second resistance state 120. The PCM structure includes a first electrode 102, a phase change material in a first phase 104 and a second phase 114, and a second electrode 106. While this geometry is specifically contemplated, it should be understood that any appropriate geometry can be used instead.

In a first resistance state 110, the proportions of the first phase 104 and the second phase 114 in the phase change material differ from those in the second resistance state 110, producing different resistances between the two states. The phase change material can be formed from any appropriate material that has two such resistance states that depend on the phase. Exemplary phase change materials can include, e.g., a chromium-germanium-tellurium alloy such as, e.g., Cr2Ge2Te6 or a germanium-antimony-tellurium alloy such as, e.g., Ge2Sb2Te5. Alternative phase change materials that can be used include, but are not limited to, an antimony-tellurium alloy, such as Sb2Te3, or a germanium-tellurium alloy, such as GeTe.

The resistance state of each weight can be altered by applying a set current that generates heat within the PCM structure. The heat causes a change in the crystalline structure of a part of the PCM structure, thereby changing the proportions between the first phase 104 and the second phase 114. The state can be reset by heating the PCM structure completely and then allowing it to cool quickly, so that it stays in an amorphous crystalline state. In some embodiments, a second PCM structure can be used in-line with a first PCM structure to form a weight that can be adjusted to either increase or decrease resistance, with switches to selectively change the resistance of each PCM structure. In such embodiments, two different phase change materials can be used, where the resistance changes in opposite directions for each when changed.

Figure 4:
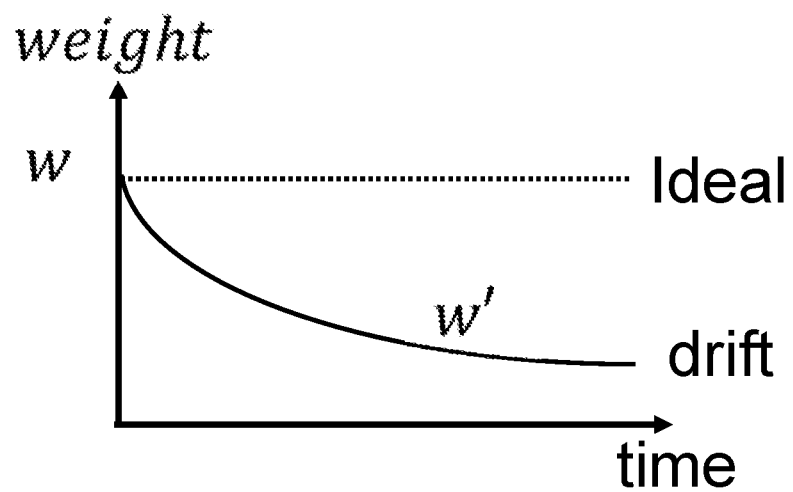
FIG. 4 illustrates an example distribution of decaying conductance value as a function of time.

While PCM devices have various advantages, as discussed above, PCM devices also suffer from conductance drift. In particular, as depicted in the example graph of FIG. 4, the conductance value decays as a function of time. As the conductance drifts, noise sources can cause inaccuracies in the Deep Neural Network (DNN) weight values, which leads to a degradation in the classification accuracy of the model. PCM devices can exhibit conductance drift over time due to structural relaxation and defect annealing in crystalline and amorphous portions of the device. The conductance drift of PCM devices typically decays predictably over time according to a model. Thus, one technique to compensate for the drift is to apply a correction factor according to the model. Such technique, however, requires the application of a carefully calibrated correction factor to compensate for the exact amount of drift during a precise time interval according to the decay model.

It is desirable to have more flexibility in compensating for the drift. For example, based on the hardware used in implementing the neural network, it may be desired to have an output current from a given neuron or layer be within a specific range, such as, but not limited to 1-10 microamps. Indeed, each neural network and layer may have a different spread in the expected or desired activation range. Thus, it would be desirable to be able to match the hardware current range by being able to apply an arbitrary scaling factor that is not tied to any precise time interval. The embodiments described herein enable the use of such an arbitrary scaling factor through selective choice of activation layer and design of the neural network. It is to be noted that other memory technologies may also suffer from conductance drift. Thus, while the embodiments discussed herein are described with respect to PCM devices, it is to be understood that the techniques described herein can also be applied to DNN implemented with other memory technologies.

Figure 2:
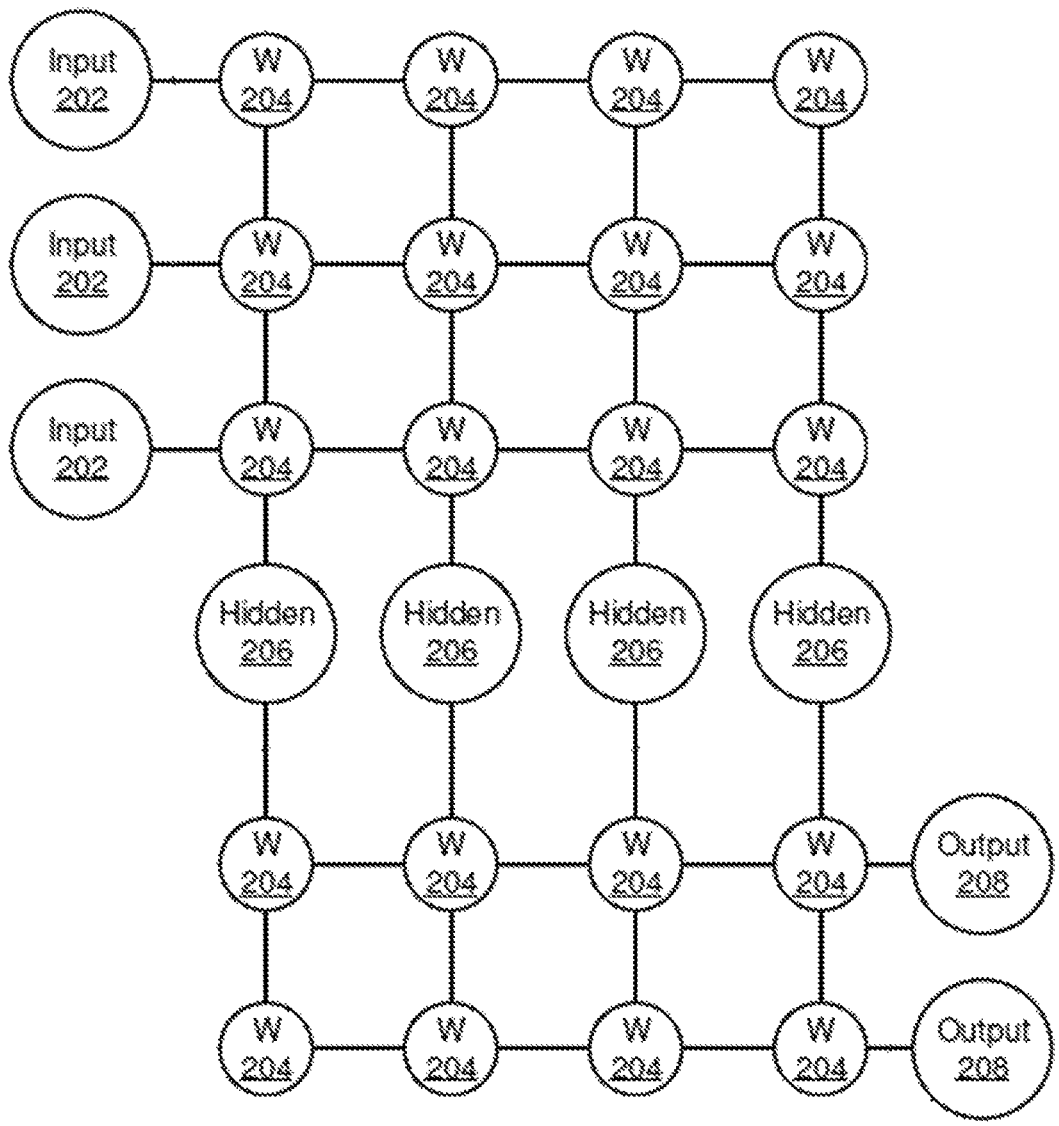
FIG. 2 depicts one embodiment of an example artificial deep neural network architecture.

FIG. 2 depicts one embodiment of an example artificial deep neural network (DNN) architecture 200. It should be understood that the present architecture is provided by way of example only and that other architectures or types of neural network can be used instead. Furthermore, the layers of neurons described below and the weights connecting them are described in a general manner and can be replaced by any type of neural network layers with any appropriate degree or type of interconnectivity. For example, layers can include convolutional layers, pooling layers, fully connected layers, attention layers, softmax layers, or any other appropriate type of neural network layer. Furthermore, layers can be added or removed as needed and the weights can be omitted for more complicated forms of interconnection.

During feed-forward operation, a set of input neurons 202 each provide an input voltage in parallel to a respective row of weights 204. In the hardware embodiment described herein, the weights 204 each have a settable resistance value, such that a current output flows from the weight 204 to a respective hidden neuron 206 to represent the weighted input. Each neuron 202 has an activation function that is used to perform a function on the incoming value.

The current from each weight 204 adds column-wise and flows to a hidden neuron 206. The hidden neurons 206 use the currents from the array of weights 204 to perform some calculation. The hidden neurons 206 then output a voltage of their own to another array of weights 204. This array performs in the same way, with a column of weights 204 receiving a voltage from their respective hidden neuron 206 to produce a weighted current output that adds row-wise and is provided to the output neuron 208. It should be understood that any number of these stages can be implemented, by interposing additional layers of arrays and hidden neurons 206.

During back propagation, the output neurons 208 provide a voltage back across the array of weights 204. The output layer compares the generated network response to training data and computes an error. The error is applied to the array as a voltage pulse, where the height and/or duration of the pulse is modulated proportional to the error value. In this example, a row of weights 204 receives a voltage from a respective output neuron 208 in parallel and converts that voltage into a current which adds column-wise to provide an input to hidden neurons 206. The hidden neurons 206 combine the weighted feedback signal with a derivative of its feed-forward calculation and stores an error value before outputting a feedback signal voltage to its respective column of weights 204. This back propagation travels through the entire network 200 until all hidden neurons 206 and the input neurons 202 have stored an error value.

During weight updates, the input neurons 202 and hidden neurons 206 apply a first weight update voltage forward and the output neurons 208 and hidden neurons 206 apply a second weight update voltage backward through the network 200. The combinations of these voltages create a state change within each weight 204, causing the weight 204 to take on a new resistance value. In this manner the weights 204 can be trained to adapt the neural network 200 to errors in its processing. It should be noted that the three modes of operation, feed forward, back propagation, and weight update, do not overlap with one another. The weights 204 can be implemented using resistive cross point devices. Such resistive devices can have switching characteristics that have a non-linearity that can be used for processing data. The weights 204 can belong to a class of device called a resistive processing unit (RPU), as discussed above.

As described in more detail below, the example DNN 200 is designed and trained without including bias neurons or bias weights. Bias is often included in neural networks to provide an additional input dimension to enable the DNN to learn. For example, bias can be used to shift a transfer function curve to enable more customization in an input-to-output mapping of the DNN based on the needs of the implementation. However, in the example of FIG. 2, bias neurons/weights are not used. By removing bias neurons/weights and selecting an appropriate activation function for the neurons, an arbitrary amplification factor can be used to scale intermediate layer activations. As used herein, an arbitrary amplification factor is a factor that does not depend on time and is not tied to precision constraints (i.e. independent of time and precision constraints). As such, an arbitrary amplification factor, as used herein, does not imply that the factor is random or unknown.

Any activation function which has a linear response for positive input and zero for negative input can be used together with removal of bias neurons/weights to enable the use of an arbitrary amplification factor. Some appropriate activation functions which can be implemented in the embodiments described herein include, but are not limited to, rectifier linear unit (ReLU), clipped (ReLU), Sigmoid, and Tan h. By removing the bias and using an appropriately selected activation function, the consequence of the drift coefficient of PCM devices is that the output of the DNN values (i.e. the values used to classify the input data) are scaled by a constant factor. Such scaling does not impact the classification accuracy of the DNN since what matters is which neuron has the highest value and not the actual absolute value.

However, due to the signal degrading from layer to layer as a result of the conductance drift, the signal can become too weak to be recognized among hardware noise. The embodiments described herein are able to compensate for the signal degradation by scaling intermediate layer activations with an arbitrary amplification factor which magnifies the signal and prevents degradation of information. Since the arbitrary factor does not depend on time, as discussed above, it is not necessary to track the elapsed time since PCM write in order to apply a scaling factor that compensates for conductance drift. Additionally, the coefficient of the arbitrary factor does not need to be precisely calculated in order to balance compensating for specific conductance drift and bias. Therefore, the arbitrary amplification factor can be selected to enable the scaling of signals to cover the entire hardware dynamic range and thereby optimize/improve the signal-to-noise ratio.

Figure 3:
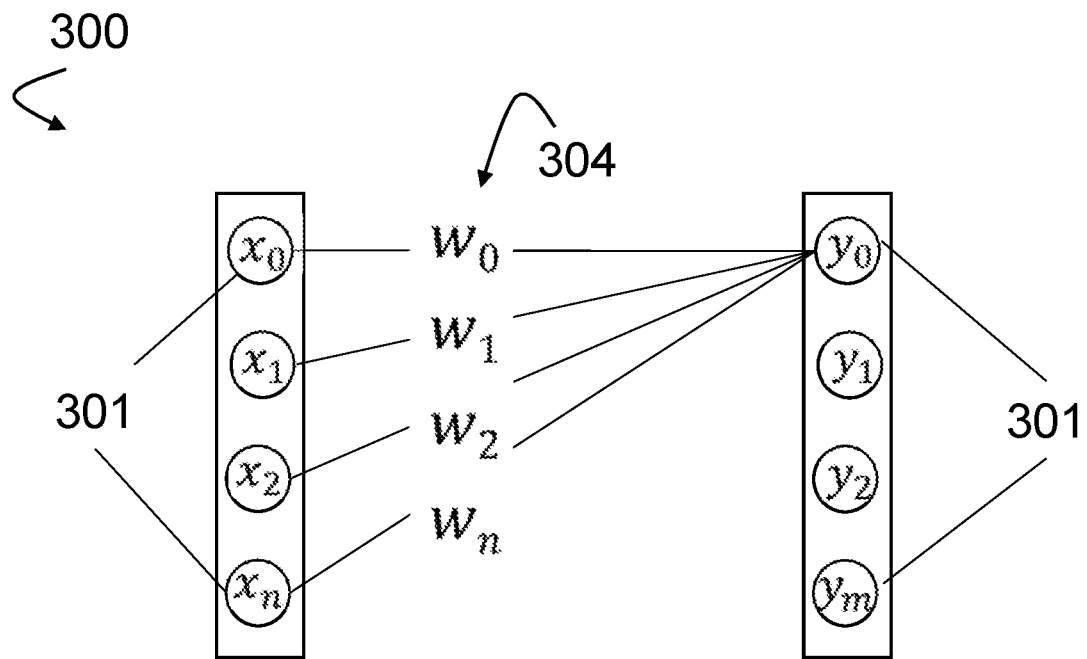
FIG. 3 is a high-level block diagram depicting an example computational graph for two layers in an artificial deep neural network.

FIG. 3 is a high-level block diagram depicting an example computational graph for two layers in an artificial deep neural network (DNN) 300. Artificial deep neural networks (DNNs) are distributed computing systems, which consist of a number of neurons 301 interconnected through connection points called synapses. Each synapse encodes the strength of the connection between the output of one neuron 301 and the input of another. The output of each neuron 301 is determined by the aggregate input received from other neurons that are connected to it. Thus, the output of a given neuron is based on the outputs of connected neurons from preceding layers and the strength of the connections as determined by the synaptic weights 304. For example, since the network does not include bias neurons/weights, the output of neuron $y_0$ can be expressed as follows in equation 1, where the activation function of $y_0$ is a ReLU function.

$$y_0 = \text{relu}(\Sigma w_i x_i) \qquad \text{Equation 1}$$

A DNN is trained to solve a specific problem (e.g., pattern recognition) by adjusting the weights of the synapses such that a particular class of inputs produce a desired output. Various algorithms may be used for this learning process. Certain algorithms may be suitable for specific tasks such as image recognition, speech recognition, or language processing. Training algorithms lead to a pattern of synaptic weights 304 that, during the learning process, converges toward an optimal solution of the given problem. As discussed above, backpropagation is one suitable algorithm for supervised learning, in which a known correct output is available during the learning process. The goal of such learning is to obtain a system that generalizes to data that were not available during training.

As discussed above, during backpropagation, an error value is calculated for each of the neurons in the output layer. The error values are propagated backwards, starting from the output layer, to determine an error value associated with each neuron. The error values correspond to each neuron's contribution to the network output. The error values are then used to update the weights 304. By incremental correction in this way, the network output is adjusted to conform to the training data. It will be appreciated that a variety of error metrics are known in the art, for example, cross-entropy loss or square of the Euclidean distance. It will likewise be appreciated that a variety of regularization methods are known in the art, including L1 (Lasso regression) or L2 (ridge regression).

Furthermore, as discussed above, the values of the weights can degrade over time which will affect the output, such as $y_0$, discussed above. By applying an arbitrary amplification factor, as described herein, the signal-to-noise ratio can be optimized for the hardware and has the advantage of not being tied to time or a precise calculated value.

Figure 5:
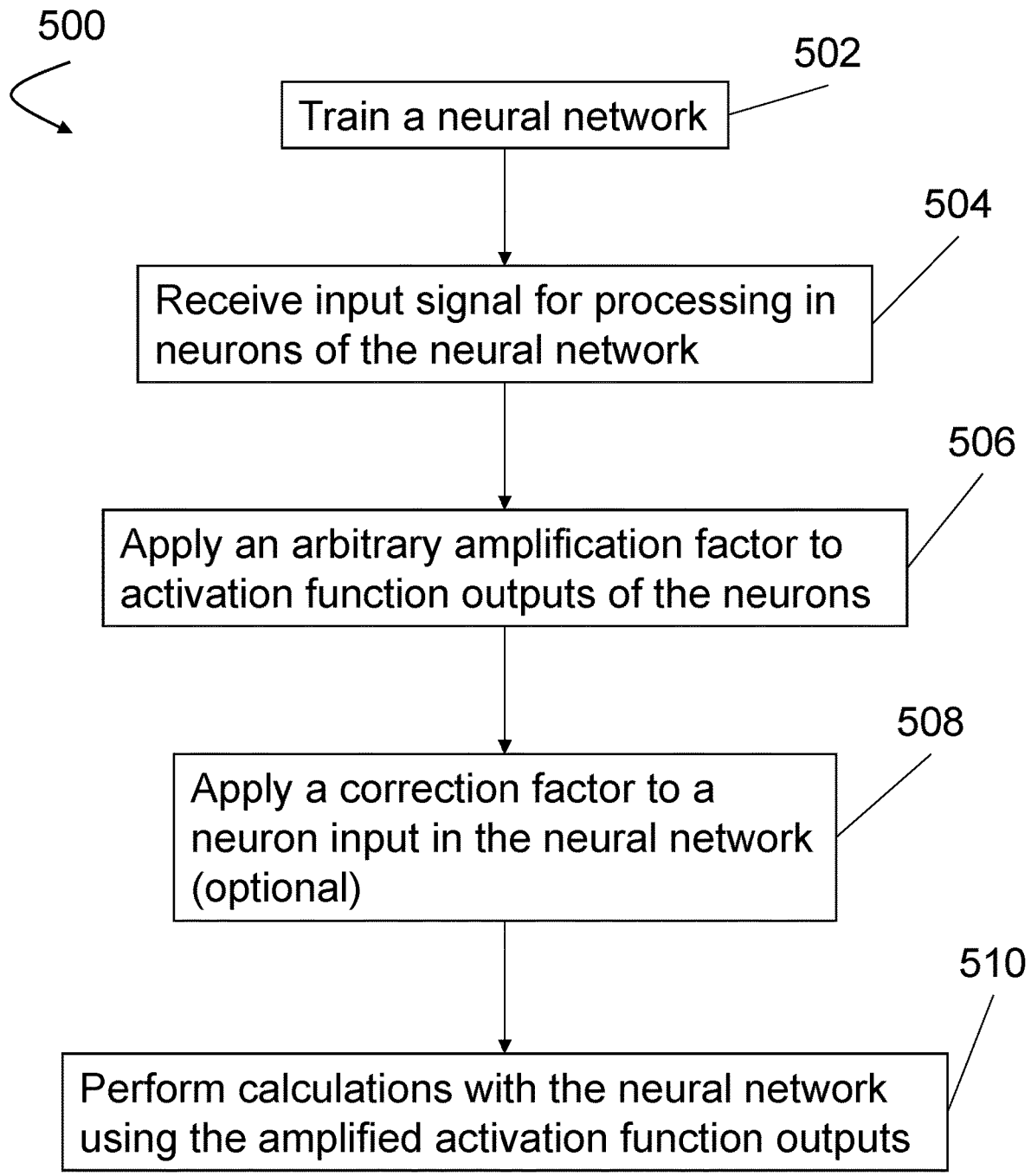
FIG. 5 is a flow chart depicting one embodiment of an example method for performing neural network calculations using a neural network.

FIG. 5 is a flow chart depicting one embodiment of an example method 500 for performing neural network calculations using a neural network such as network 200. Method 500 can be performed by a neural network processing system such as system 700 described below. It is to be understood that the order of actions in example method 400 is provided for purposes of explanation and that the method can be performed in a different order in other embodiments. Similarly, it is to be understood that some actions can be omitted, or additional actions can be included in other embodiments.

At 502, a neural network, such as neural network 200 is trained. The neural network has a plurality of neurons and includes a plurality of resistive processing unit (RPU) weights as discussed above. Each neuron has an activation function, such as a ReLU activation function. Furthermore, in some embodiments, the neural network can be comprised of a plurality of layers, with each layer having one or more of the plurality of neurons. The training can be performed using a set of training data to determine appropriate values for the RPU weights sets those values in accordance with the type of RPU (e.g., by providing a set current pulse to the weights). As discussed above, in some embodiments, the neural network is trained without bias neurons/weights. In other words, in some embodiments the neural network has zero bias neurons.

At 504, an input signal is received for processing in one or more neurons of the neural network. At 506, an arbitrary amplification factor is applied to activation function outputs of the neurons in the neural network. The arbitrary amplification factor is based on a dynamic range of components in the neural network, in some embodiments. As discussed above, the arbitrary amplification factor compensates for conductance drift in values of the RPU weights. However, the arbitrary amplification factor is selected independent of the drift coefficient of the plurality of RPU weights and independent of the time that has elapsed since the RPU weights were programmed. Thus, the arbitrary amplification factor is independent of time and precision constraints.

At 508, a correction factor is optionally applied to at least one neuron input in the neural network. For example, in some embodiments, the neural network comprises a plurality of layers and at least one skip connection connecting a first neuron in a first layer of the plurality of layers with a second neuron in a second layer of the plurality of layers by skipping one or more intermediate layers between the first layer and the second layer. Since the input signal from the first neuron to the second neuron will not pass through the intermediate layers, the signal will not have degraded or decayed the same as signals that do pass through the intermediate layers. In order to correct for this type of situation, the correction factor can be applied to the input signal from the first neuron.

The correction factor is based on a drift coefficient of the RPU weights and a time that has elapsed since the RPU weights were programmed. Thus, unlike the arbitrary amplification factor, the correction factor is dependent on time and precision constraints. Additionally, in some embodiments, the neural network can include bias neurons/weights. In such embodiments, the correction factor can be applied to input signals from the bias neurons to balance the inputs to a neuron such that the arbitrary amplification factor discussed herein can be applied to the activation function outputs of the neuron. Further details regarding techniques for determining and applying such a correction factor are discussed in co-pending U.S. patent application Ser. No. 16/388,320, which is incorporated herein by reference.

At 510, a calculation is performed with the neural network using the amplified activation function outputs of the one or more neurons. For example, the calculations on received input signals can include, but are not limited to, image classification, machine learning, artificial intelligence, self-driving cars, processing real-time sensor data and inferences for internet of things devices, etc. By enabling the amplifying of the activation function outputs with an arbitrary amplification factor, method 500 improves the signal-to-noise ratio of the neural network and provides greater flexibility in compensating for conductance drift of RPU weights. Thus, the neural network can tolerate more conductance drift and reduce and/or eliminate accuracy loss due to conductance drift. As such, the embodiments described herein can be used to increase processing speed and efficiency of neural networks.

Figure 6:
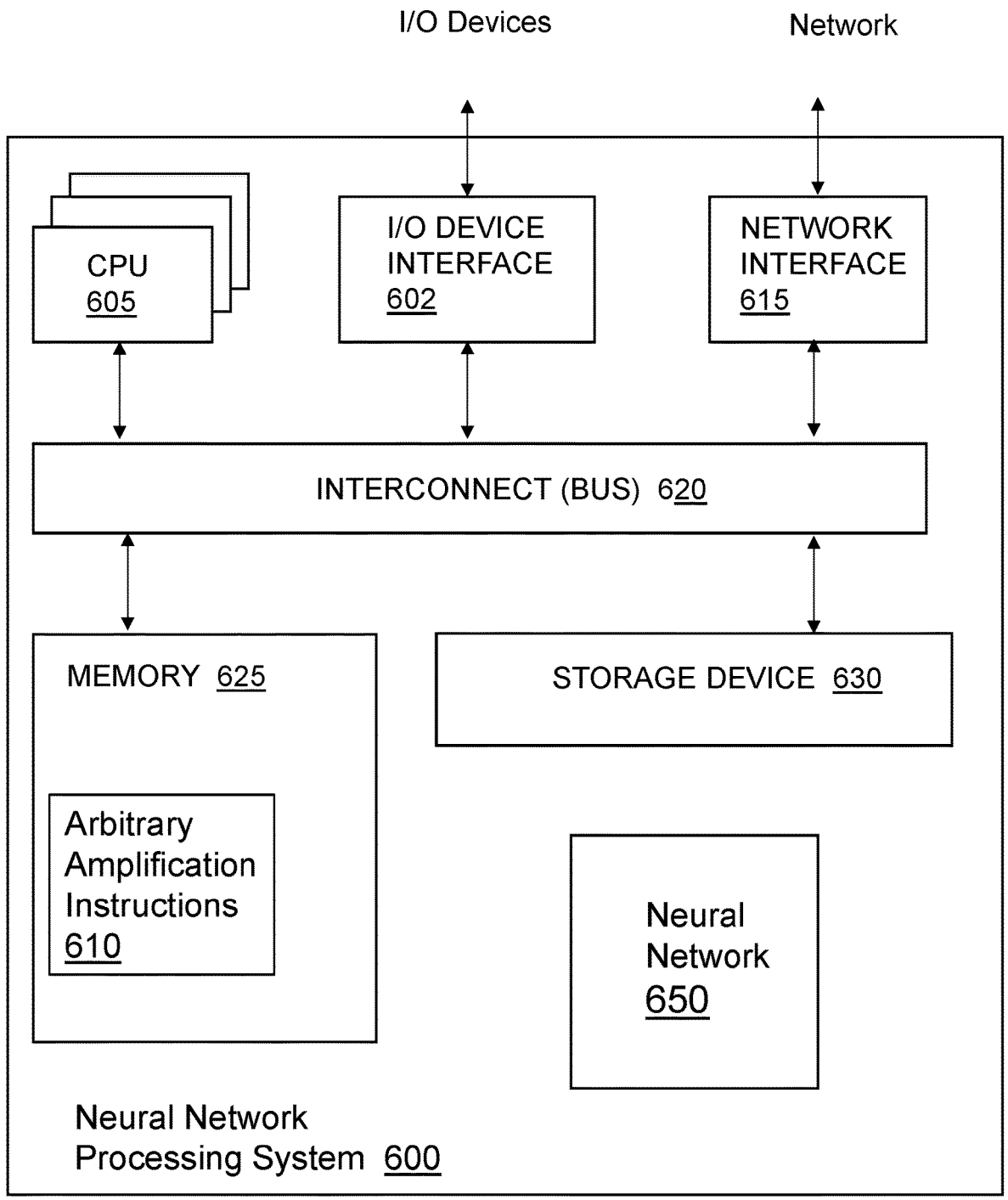
FIG. 6 is a block diagram depicting one embodiment of an example neural network processing system.

FIG. 6 is a block diagram depicting one embodiment of an example neural network processing system 600. The system 600 includes a DNN 650 that is implemented with hardware weights, for example in the form of RPUs such as phase change memory devices. The DNN 650 can take the form of any appropriate neural network structure, with any number of neuron layers and any appropriate activation function(s). For example, the DNN 650 can be implemented using example neural network 200 discussed above.

The system 600 also includes a memory 625, storage 630, an interconnect (e.g., BUS) 620, one or more processors 605 (also referred to as CPU 605 herein), an I/O device interface 602, and a network interface 615. It is to be understood that the system 600 is provided by way of example only and that the system 600 can be implemented differently in other embodiments. For example, in other embodiments, some of the components shown in FIG. 6 can be omitted and/or other components can be included.

Each CPU 605 retrieves and executes programming instructions stored in the memory 625 and/or storage 630. The interconnect 620 is used to move data, such as programming instructions, between the CPU 605, I/O device interface 602, storage 630, network interface 615, and memory 625. The interconnect 620 can be implemented using one or more busses. The CPUs 605 can be a single CPU, multiple CPUs, or a single CPU having multiple processing cores in various embodiments. In some embodiments, a processor 605 can be a digital signal processor (DSP). Memory 625 is generally included to be representative of a random access memory (e.g., static random access memory (SRAM), dynamic random access memory (DRAM), or Flash). The storage 630 is generally included to be representative of a non-volatile memory, such as a hard disk drive, solid state device (SSD), removable memory cards, optical storage, or flash memory devices. In an alternative embodiment, the storage 630 can be replaced by storage area-network (SAN) devices, the cloud, or other devices connected to the system 600 via the I/O device interface 602 or via a communication network coupled to the network interface 615.

In some embodiments, the memory 625 stores arbitrary amplification instructions 610. However, in various embodiments, the arbitrary amplification instructions 610 are stored partially in memory 625 and partially in storage 630, or they are stored entirely in memory 625 or entirely in storage 630, or they are accessed over a network via the network interface 615. The CPU 605 can execute the arbitrary amplification instructions 610 to implement one or more of the functions discussed herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

EXAMPLE EMBODIMENTS

Example 1 includes a method. The method comprises receiving an input signal for processing in one or more neurons of a neural network, wherein the neural network has zero bias neurons and includes a plurality of resistive processing unit (RPU) weights, each neuron having an activation function; applying an arbitrary amplification factor to activation function outputs of the one or more neurons in the neural network, wherein the arbitrary amplification factor is based on a dynamic range of components in the neural network and compensates for conductance drift in values of the RPU weights; and performing a calculation with the neural network using the amplified activation function outputs of the one or more neurons.

Example 2 includes the method of example 1, wherein the activation function of each neuron in the neural network is a rectifier linear unit (ReLU) function.

Example 3 includes the method of any of examples 1-2, wherein the plurality of RPU weights are implemented using phase change memory (PCM) devices.

Example 4 includes the method of any of examples 1-3, wherein the neural network comprises a plurality of layers, each layer comprising at least one of the one or more neurons; and wherein applying the arbitrary amplification factor to activation function outputs of the one or more neurons in the neural network comprises applying a respective arbitrary amplification factor value for each layer of the plurality of layers.

Example 5 includes the method of example 4, wherein the respective arbitrary amplification factor value for each layer is different from the respective arbitrary amplification factor value of another layer of the plurality of layers.

Example 6 includes the method of any of examples 1-5, wherein the neural network comprises a plurality of layers, each layer comprising at least one of the one or more neurons; wherein the neural network includes at least one skip connection connecting a first neuron in a first layer of the plurality of layers with a second neuron in a second layer of the plurality of layers by skipping one or more intermediate layers between the first layer and the second layer; wherein the method further comprises applying a correction factor to attenuate a signal communicated over the skip connection from the first neuron to the second neuron, the correction factor based on a drift coefficient of the RPU weights and a time that has elapsed since the RPU weights were programmed.

Example 7 includes a method. The method comprises applying a correction factor to at least one neuron input in a neural network having a plurality of neurons and a plurality of resistive processing unit (RPU) weights, wherein each neuron has an activation function and the correction factor is based on a drift coefficient of the plurality of RPU weights and a time that has elapsed since the RPU weights were programmed; applying an amplification factor to activation function outputs of the plurality of neurons in the neural network, the amplification factor selected independent of the drift coefficient of the plurality of RPU weights and independent of the time that has elapsed since the RPU weights were programmed; and performing a calculation with the neural network using the amplified activation function outputs of the plurality of neurons.

Example 8 includes the method of example 7, wherein applying the correction factor to the at least one neuron input comprises applying the correction factor to a skip connection input.

Example 9 includes the method of any of examples 7-8, wherein applying the correction factor to the at least one neuron input comprises applying the correction factor to a neuron input received from a bias neuron in the neural network.

Example 10 includes the method of any of examples 7-9, wherein the activation function of each neuron in the neural network is a rectifier linear unit (ReLU) function.

Example 11 includes the method of any of examples 7-10, wherein the plurality of RPU weights are implemented using phase change memory (PCM) devices.

Example 12 includes the method of any of examples 7-11, wherein the neural network comprises a plurality of layers, each layer comprising at least one of the plurality of neurons; and wherein applying the amplification factor to activation function outputs of the plurality of neurons in the neural network comprises applying a respective amplification factor value for each layer of the plurality of layers.

Example 13 includes the method of example 12, wherein the respective amplification factor value for each layer is different from the respective amplification factor value of another layer of the plurality of layers.

Example 14 includes a system. The system comprises a neural network that includes a plurality of neurons and a plurality of resistive processing unit (RPU) weights, wherein each of the plurality of neurons has an activation function and the neural network has zero bias neurons; and a processing unit configured to apply an arbitrary amplification factor to activation function outputs of the one or more neurons in the neural network, wherein the arbitrary amplification factor is based on a dynamic range of components in the neural network and compensates for conductance drift in values of the RPU weights; and wherein the neural network is configured to perform a calculation using the amplified activation function outputs of the one or more neurons.

Example 15 includes the system of example 14, wherein the neural network comprises a plurality of layers, each layer comprising at least one of the one or more neurons; and wherein the processing unit is configured to apply a respective arbitrary amplification factor for each layer of the plurality of layers, wherein the respective arbitrary amplification factor for each layer is different from the respective arbitrary amplification factor of another layer of the plurality of layers.

Example 16 includes the system of any of examples 14-15, wherein the plurality of RPU weights comprise phase change memory (PCM) devices.

Example 17 includes the system of any of examples 14-16, wherein the neural network comprises a plurality of layers, each layer comprising at least one of the one or more neurons; wherein the neural network includes at least one skip connection connecting a first neuron in a first layer of the plurality of layers with a second neuron in a second layer of the plurality of layers by skipping one or more intermediate layers between the first layer and the second layer; wherein the processor is further configured to apply a correction factor to attenuate a signal communicated over the skip connection from the first neuron to the second neuron, the correction factor based on a drift coefficient of the RPU weights and a time that has elapsed since the RPU weights were programmed.

Example 18 includes a system. The system comprises a neural network that includes a plurality of neurons and a plurality of resistive processing unit (RPU) weights, wherein each of the plurality of neurons has an activation function; and a processing unit configured to apply a correction factor to at least one neuron input in the neural network, wherein the correction factor is based on a drift coefficient of the plurality of RPU weights and a time that has elapsed since the RPU weights were programmed; and to apply an amplification factor to activation function outputs of the plurality of neurons in the neural network, wherein the amplification factor selected independent of the drift coefficient of the plurality of RPU weights and independent of the time that has elapsed since the RPU weights were programmed; and wherein the neural network is configured to perform a calculation using the amplified activation function outputs of the one or more neurons.

Example 19 includes the system of example 18, wherein the neural network comprises a plurality of layers, each layer comprising at least one of the plurality of neurons; wherein the neural network includes at least one skip connection connecting a first neuron in a first layer of the plurality of layers with a second neuron in a second layer of the plurality of layers by skipping one or more intermediate layers between the first layer and the second layer; wherein the processing unit is configured to apply the correction factor to the at least one skip connection.

Example 20 includes the system of any of examples 18-19, wherein the processing unit is configured to apply the correction factor to a neuron input received from a bias neuron in the neural network.

Example 21 includes the system of any of examples 18-20, wherein the neural network comprises a plurality of layers, each layer comprising at least one of the plurality of neurons; and wherein the processing unit is configured to apply a respective amplification factor for each layer of the plurality of layers, wherein the respective amplification factor for each layer is different from the respective amplification factor of another layer of the plurality of layers.

Example 22 includes the system of any of examples 18-21, wherein the plurality of RPU weights comprise phase change memory (PCM) devices.

Example 23 includes a computer program product comprising a computer readable storage medium having a computer readable program stored therein, wherein the computer readable program, when executed by a processor, causes the processor to: applying an arbitrary amplification factor to activation function outputs of one or more neurons in a neural network; wherein the neural network has zero bias neurons and includes a plurality of resistive processing unit (RPU) weights and each neuron has an activation function; wherein the arbitrary amplification factor is based on a dynamic range of components in the neural network and compensates for conductance drift in values of the RPU weights; and wherein the neural network is configured to perform a calculation using the amplified activation function outputs of the one or more neurons.

Example 24 includes the computer program product of example 23, wherein the neural network comprises a plurality of layers, each layer comprising at least one of the one or more neurons; wherein the neural network includes at least one skip connection connecting a first neuron in a first layer of the plurality of layers with a second neuron in a second layer of the plurality of layers by skipping one or more intermediate layers between the first layer and the second layer; wherein the computer readable program is further configured to cause the processor to apply a correction factor to attenuate a signal communicated over the skip connection from the first neuron to the second neuron, the correction factor based on a drift coefficient of the RPU weights and a time that has elapsed since the RPU weights were programmed.

Example 25 includes the computer program product of any of examples 23-24, wherein the neural network comprises a plurality of layers, each layer comprising at least one of the one or more neurons; wherein the computer readable program is further configured to cause the processor to apply a respective arbitrary amplification factor for each layer of the plurality of layers, wherein the respective arbitrary amplification factor for each layer is different from the respective arbitrary amplification factor of another layer of the plurality of layers.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A method comprising:
   receiving an input signal for processing in one or more neurons of a neural network, wherein the neural network includes a plurality of resistive processing unit (RPU) devices, where values of the plurality of RPU devices are RPU weights that connect layers of neurons in the neural network, each neuron of the neural network having an activation function to compensate for conductance drift in the values of the RPU weights, and the neural network does not include bias neurons;

applying an arbitrary amplification factor to activation function outputs of the one or more neurons in the neural network, wherein the arbitrary amplification factor is based on a dynamic range of components in the neural network and compensates for the conductance drift in the values of the RPU weights; and performing a calculation with the neural network using the amplified activation function outputs of the one or more neurons.

2. The method of claim 1, wherein the activation function of each neuron in the neural network is a rectifier linear unit (ReLU) function.

3. The method of claim 1, wherein the plurality of RPU devices are implemented using phase change memory (PCM) devices.

4. The method of claim 1, wherein the neural network comprises a plurality of layers, each layer comprising at least one of the one or more neurons; and wherein applying the arbitrary amplification factor to activation function outputs of the one or more neurons in the neural network comprises applying a respective arbitrary amplification factor value for each layer of the plurality of layers.

5. The method of claim 4, wherein the respective arbitrary amplification factor value for each layer is different from the respective arbitrary amplification factor value of another layer of the plurality of layers.

6. The method of claim 1, wherein the neural network comprises a plurality of layers, each layer comprising at least one of the one or more neurons;

wherein the neural network includes at least one skip connection connecting a first neuron in a first layer of the plurality of layers with a second neuron in a second layer of the plurality of layers by skipping one or more intermediate layers between the first layer and the second layer;

wherein the method further comprises applying a correction factor to attenuate a signal communicated over the skip connection from the first neuron to the second neuron, the correction factor based on a drift coefficient of the RPU weights and a time that has elapsed since the RPU weights were programmed.

7. A method comprising:

applying a correction factor to at least one neuron input in a neural network, wherein the neural network includes a plurality of resistive processing unit (RPU) devices, where values of the plurality of RPU devices are RPU weights that connect layers of neurons in the neural network, wherein each neuron has an activation function to compensate for conductance drift in the values of the RPU weights and the correction factor is based on a drift coefficient of the plurality of RPU weights and a time that has elapsed since the RPU weights were programmed;

applying an amplification factor to activation function outputs of the plurality of neurons in the neural network, the amplification factor selected independent of the drift coefficient of the plurality of RPU weights and independent of the time that has elapsed since the RPU weights were programmed; and performing a calculation with the neural network using the amplified activation function outputs of the plurality of neurons.

8. The method of claim 7, wherein applying the correction factor to the at least one neuron input comprises applying the correction factor to a skip connection input.

9. The method of claim 7, wherein applying the correction factor to the at least one neuron input comprises applying the correction factor to a neuron input received from a bias neuron in the neural network.

10. The method of claim 7, wherein the activation function of each neuron in the neural network is a rectifier linear unit (ReLU) function.

11. The method of claim 7, wherein the plurality of RPU devices are implemented using phase change memory (PCM) devices.

12. The method of claim 7, wherein the neural network comprises a plurality of layers, each layer comprising at least one of the plurality of neurons; and wherein applying the amplification factor to activation function outputs of the plurality of neurons in the neural network comprises applying a respective amplification factor value for each layer of the plurality of layers.

13. The method of claim 12, wherein the respective amplification factor value for each layer is different from the respective amplification factor value of another layer of the plurality of layers.

14. A system comprising:

a neural network that includes one or more neurons and a plurality of resistive processing unit (RPU) devices, where values of the plurality of RPU devices are RPU weights that connect layers of neurons in the neural network, wherein each of the plurality of neurons has an activation function to compensate for conductance drift in the values of the RPU weights, and the neural network does not include bias neurons; and a processing unit configured to apply an arbitrary amplification factor to activation function outputs of the one or more neurons in the neural network, wherein the arbitrary amplification factor is based on a dynamic range of components in the neural network and compensates for the conductance drift in the values of the RPU weights; and wherein the neural network is configured to perform a calculation using the amplified activation function outputs of the one or more neurons.

15. The system of claim 14, wherein the neural network comprises a plurality of layers, each layer comprising at least one of the one or more neurons; and wherein the processing unit is configured to apply a respective arbitrary amplification factor for each layer of the plurality of layers, wherein the respective arbitrary amplification factor for each layer is different from the respective arbitrary amplification factor of another layer of the plurality of layers.

16. The system of claim 14, wherein the plurality of RPU devices comprise phase change memory (PCM) devices.

17. The system of claim 14, wherein the neural network comprises a plurality of layers, each layer comprising at least one of the one or more neurons;

wherein the neural network includes at least one skip connection connecting a first neuron in a first layer of the plurality of layers with a second neuron in a second layer of the plurality of layers by skipping one or more intermediate layers between the first layer and the second layer;

wherein the processor is further configured to apply a correction factor to attenuate a signal communicated over the skip connection from the first neuron to the second neuron, the correction factor based on a drift coefficient of the RPU weights and a time that has elapsed since the RPU weights were programmed.

18. A system comprising:
a neural network that includes a plurality of neurons and a plurality of resistive processing unit (RPU) devices, where values of the plurality of RPU devices are RPU weights that connect layers of neurons in the neural network, wherein each of the plurality of neurons has an activation function to compensate for conductance drift in the values of the RPU weights; and
a processing unit configured to:
apply a correction factor to at least one neuron input in the neural network, wherein the correction factor is based on a drift coefficient of the plurality of RPU weights and a time that has elapsed since the RPU weights were programmed; and
apply an amplification factor to activation function outputs of the plurality of neurons in the neural network, wherein the amplification factor selected independent of the drift coefficient of the plurality of RPU weights and independent of the time that has elapsed since the RPU weights were programmed; and
wherein the neural network is configured to perform a calculation using the amplified activation function outputs of the one or more neurons.

19. The system of claim 18, wherein the neural network comprises a plurality of layers, each layer comprising at least one of the plurality of neurons;
wherein the neural network includes at least one skip connection connecting a first neuron in a first layer of the plurality of layers with a second neuron in a second layer of the plurality of layers by skipping one or more intermediate layers between the first layer and the second layer;
wherein the processing unit is configured to apply the correction factor to the at least one skip connection.

20. The system of claim 18, wherein the processing unit is configured to apply the correction factor to a neuron input received from a bias neuron in the neural network.

21. The system of claim 18, wherein the neural network comprises a plurality of layers, each layer comprising at least one of the plurality of neurons; and
wherein the processing unit is configured to apply a respective amplification factor for each layer of the plurality of layers, wherein the respective amplification factor for each layer is different from the respective amplification factor of another layer of the plurality of layers.

22. The system of claim 18, wherein the plurality of RPU devices comprise phase change memory (PCM) devices.

23. A computer program product comprising a computer readable storage medium having a computer readable program stored therein, wherein the computer readable program, when executed by a processor, causes the processor to:
applying an arbitrary amplification factor to activation function outputs of one or more neurons in a neural network;
wherein the neural network includes a plurality of resistive processing unit (RPU) devices, where values of the plurality of RPU devices are RPU weights that connect layers of neurons in the neural network, each neuron having an activation function to compensate for conductance drift in the values of the RPU weights, and the neural network does not include bias neurons;
wherein the arbitrary amplification factor is based on a dynamic range of components in the neural network and compensates for the conductance drift in the values of the RPU weights; and
wherein the neural network is configured to perform a calculation using the amplified activation function outputs of the one or more neurons.

24. The computer program product of claim 23, wherein the neural network comprises a plurality of layers, each layer comprising at least one of the one or more neurons;
wherein the neural network includes at least one skip connection connecting a first neuron in a first layer of the plurality of layers with a second neuron in a second layer of the plurality of layers by skipping one or more intermediate layers between the first layer and the second layer;
wherein the computer readable program is further configured to cause the processor to apply a correction factor to attenuate a signal communicated over the skip connection from the first neuron to the second neuron, the correction factor based on a drift coefficient of the RPU weights and a time that has elapsed since the RPU weights were programmed.

25. The computer program product of claim 23, wherein the neural network comprises a plurality of layers, each layer comprising at least one of the one or more neurons;
wherein the computer readable program is further configured to cause the processor to apply a respective arbitrary amplification factor for each layer of the plurality of layers, wherein the respective arbitrary amplification factor for each layer is different from the respective arbitrary amplification factor of another layer of the plurality of layers.

* * * * *